US010001269B2

(12) United States Patent
Hong et al.

(10) Patent No.: US 10,001,269 B2
(45) Date of Patent: Jun. 19, 2018

(54) LIGHT SOURCE MODULE, FABRICATION METHOD THEREFOR, AND LIGHTING DEVICE INCLUDING THE SAME

(71) Applicant: LG ELECTRONICS INC., Seoul (KR)

(72) Inventors: Jaepyo Hong, Seoul (KR); Jaechan Kim, Seoul (KR); Injoong Kim, Seoul (KR); Hyeuk Chang, Seoul (KR); Sumin Jun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 54 days.

(21) Appl. No.: 15/152,989

(22) Filed: May 12, 2016

(65) Prior Publication Data

US 2017/0009974 A1    Jan. 12, 2017

(30) Foreign Application Priority Data

Jul. 6, 2015 (KR) .................. 10-2015-0096032
Dec. 14, 2015 (KR) .................. 10-2015-0178644
Mar. 24, 2016 (KR) .................. 10-2016-0035449

(51) Int. Cl.
*F21V 21/00* (2006.01)
*F21V 29/74* (2015.01)
(Continued)

(52) U.S. Cl.
CPC .............. *F21V 29/74* (2015.01); *H01L 33/64* (2013.01); *H01L 33/642* (2013.01);
(Continued)

(58) Field of Classification Search
USPC ........................................ 362/249.01, 249.02
See application file for complete search history.

(56) References Cited

U.S. PATENT DOCUMENTS 8,803,183 B2 * 8/2014 Chang .................. H01L 33/642
257/100
2005/0122018 A1    6/2005 Morris
(Continued)

FOREIGN PATENT DOCUMENTS

EP        2608640 A2    6/2013
JP        2001-57406 A  2/2001
(Continued)

*Primary Examiner* — Vip Patel
(74) *Attorney, Agent, or Firm* — Birch, Stewart, Kolasch & Birch, LLP

(57) ABSTRACT

A light source module includes at least one light source emitting light, and a body supporting the light source, wherein the body includes a heat sink absorbing heat from the light source and dissipating the heat to the outside, an insulating layer having electrical insulating properties, the insulating layer being provided on at least one surface of the heat sink, and a conductive layer contacted with the insulating layer, the conductive layer being at least provided in a path region in which electric current is applied to the light source, the conductive layer being contacted with the light source. Accordingly, it is possible to obtain effects such as rapid fabrication processes, inexpensive fabrication cost, facilitation of mass production, improvement of product yield, and promotion of heat dissipation. Furthermore, it is possible to obtain various effects that can be understood through configurations described in embodiments.

20 Claims, 11 Drawing Sheets

(51) Int. Cl.
*H01L 33/64* (2010.01)
*H01L 33/62* (2010.01)
*F21Y 101/02* (2006.01)

(52) U.S. Cl.
CPC ........ *H01L 33/647* (2013.01); *F21Y 2101/02* (2013.01); *H01L 33/62* (2013.01)

(56) References Cited

U.S. PATENT DOCUMENTS

| | | |
|---|---|---|
| 2011/0291149 A1 | 12/2011 | Sugizaki et al. |
| 2013/0027947 A1 | 1/2013 | Villard et al. |
| 2015/0146422 A1 | 5/2015 | Kwak et al. |
| 2017/0009976 A1* | 1/2017 | Hong ............... F21V 29/74 |

FOREIGN PATENT DOCUMENTS

| | | |
|---|---|---|
| KR | 10-1472403 B1 | 12/2014 |
| KR | 10-2015-0030552 A | 3/2015 |

* cited by examiner

LIGHT SOURCE MODULE, FABRICATION METHOD THEREFOR, AND LIGHTING DEVICE INCLUDING THE SAME

CROSS-REFERENCE TO RELATED APPLICATIONS

The present application claims the benefits of priority to Korean Patent Application No. 10-2015-0178644 filed on 14 Dec. 2015, 10-2015-0096032 filed on 6 Jul. 2015, and 10-2016-0035449 filed on 24 Mar. 2016, which are herein incorporated by reference in their entirety.

BACKGROUND

The present disclosure relates to a light source module, a fabrication method therefor, and a lighting device including the same.

In general, incandescent bulbs or fluorescent lamps are frequently used as indoor or outdoor lighting devices. However, the lifespan of the incandescent bulbs or the fluorescent lamps is short, and therefore, it is necessary to frequently replace the incandescent bulbs or the fluorescent lamps with new ones. The fluorescent lamps can be used for a long period of time as compared with the incandescent bulbs, but are harmful to the environment. In addition, the fluorescent lamps are deteriorated over time, and therefore, the illumination intensity of the fluorescent lamps is gradually reduced.

In order to solve these problems, there has been proposed a light emitting diode (LED) capable of exhibiting excellent controllability, rapid response speed, high electric/light conversion efficiency, long lifespan, low power consumption, high luminance, and emotional lighting. Also, there have been developed various types of lighting modules and lighting devices employing the LED.

The LED is a semiconductor device that converts electric energy into light. The LED has advantages of low power consumption, semi-permanent lifespan, rapid response speed, safety, and environmental friendly properties as compared with existing light sources such as fluorescent lamps and incandescent bulbs. For these reasons, much research has been conducted to replace the existing light sources with the LED. Furthermore, the LED has been increasingly used as light sources of lighting devices, such as various liquid crystal displays, electric bulletin boards, and streetlights, which are used indoors and outdoors.

A light emitting device (hereinafter, the light emitting device is mainly referred to as an LED, but the present disclosure is not limited thereto) is used in the form of a plurality of light emitting devices that are integrated to implement high luminance. Thus, the light emitting device is fabricated in the form of a light source module for improving assembly convenience and protecting the light emitting device from external impact and moisture. In the light source module, a plurality of light emitting devices is integrated with high density, and hence higher luminance can be realized. However, heat of a high temperature is generated from the light emitting module. Accordingly, much research has been conducted to effectively dissipate heat from the light emitting module.

Under the circumstances, Korean Patent Registration No. 10-1472403 filed and registered by the present applicant has disclosed a light source module for solving the problem of heat dissipation.

The light source module above is fabricated by coupling, to a heat sink, a printed circuit board (PCB) having a plurality of light emitting devices mounted on the heat sink. However, such a fabrication method requires a plurality of processes. For this reason, fabrication time is increased, and much cost is required.

In order to improve heat dissipation efficiency, a thermal pad is further inserted between the PCB and the heat sink. However, the heat transfer property of the PCB is not excellent in itself, and hence heat is not effectively transferred to the heat sink. As a result, the problem of heat dissipation, which occurs in high-luminance light source modules, is not solved to a considerable degree.

In addition, it is necessary to separately insert the thermal pad, and hence cost and time are further required.

SUMMARY

It is an object of the invention to provide a light source module, a fabrication method therefor, and lighting device including the same with improved heat dissipation efficiency and simplified production processes by eliminating the need for a separate PCB, and to inexpensively produce the light source module in large quantities. This object is achieved with the features of the claims.

A preferred technical effect or advantage of the light source module, the fabrication method therefor, and the lighting device achieves rapid fabrication processes and inexpensive fabrication cost.

A further preferred technical effect or advantage of the light source module, the fabrication method therefor, and the lighting device, is that a high luminance can be realized due to the improved heat dissipation.

A further preferred technical effect or advantage of the light source module, the fabrication method therefor, and the lighting device is improved product yield, that may occur due to a short circuit, disconnection, component part separation, etc.

A further preferred technical effect or advantage of the light source module, the fabrication method therefor, and the lighting device is that it can be implemented suitable for mass production.

In one embodiment, a light source module includes: a light source, a heat sink absorbing heat from a light source and dissipating the heat to the outside; an insulating layer provided on at least one surface of the heat sink; and a conductive layer contacted with the insulating layer, the conductive layer being contacted with the light source. Accordingly, it is possible to improve heat dissipation efficiency and to inexpensively fabricate the light source module.

The conductive layer may be provided at least in a path region in which electric current is applied to the light source.

The insulating layer may be formed on a surface of the heat sink. The insulating layer may be formed on the entire surface of the heat sink. Alternatively, the insulating layer may be formed on only a portion of the entire surface. The insulating layer may be provided as a thin film. Thus, the efficiency of heat dissipated to the heat sink is improved.

The light source module may include a metal junction face provided at a surface where the conductive layer and the insulating layer are contacted with each other.

The metal junction face may include at least one of a metal core and a trench. The metal junction face may be provided in a recession part recessed in the insulating layer. The metal junction face may be provided at a bottom surface of a recess part recessed downward from a top surface of the insulating layer.

A bonding layer may be interposed between the light source and the conductive layer. A lower-temperature solder paste may be used in the bonding layer.

The conductive layer may be provided in a single layer, and is preferably made of a metal selected from the group consisting of copper, nickel, silver, and gold. The conductive layer may be provided by plating the same material or different metals in multiple layers. The material is preferably selected from the group consisting of copper, nickel, silver, and gold. In case of multiple layers, copper is stacked at a lower portion of the conductive layer, and nickel is stacked at an upper portion of the conductive layer.

The conductive layer may further protrude from the top surface of the insulating layer.

The insulating layer has electrical insulating properties. However, the insulating layer preferably has no or low thermal insulating properties.

The light source may be a light emitting element.

The light source may be supported by a body.

In a preferred embodiment, a heat dissipation fin and an air guiding part are further provided in the body, and the insulating layer is provided on surfaces of the heat dissipation fin and the air guiding part. When the heat dissipation fin and the air guiding part are formed with the heat sink as a single body, the insulating layer may also be formed on surfaces of the heat dissipation fin and the air guiding part. In this case, the insulating layer may be formed on the entire surface of each component part, or may be formed on only a portion of the entire surface.

The conductive layer may be provided in a recess part of the insulating layer formed at a position at which the conductive layer is to be provided. The conductive layer may be stacked up to a range exceeding the depth of the recess part. Accordingly, the resistance of the conductive layer can be reduced by increasing the area of the conductive layer to which electric current is applied, and thus the amount of heat generated by the resistance can be reduced.

In another embodiment, a light source module includes: an insulating layer substantially being adhereable to a heat sink, the insulating layer being formed thin not to interfere with heat transfer; a conductive layer provided on the insulating layer; and a recess part provided by recessing the insulating layer through laser processing such that the conductive layer is stacked therein. Accordingly, it is possible to improve heat dissipation efficiency and to inexpensively produce the light source module in large quantities.

In another embodiment, a light source module includes: an insulating layer applied on a heat sink, the insulating layer having a first thickness region and a second thickness region thinner than the first thickness region; and a plating layer provided in the second thickness region. Accordingly, it is possible to inexpensively implement the light source module in large quantities.

The plating layer may be at least provided in a path region in which electric current is applied to the light source.

In another embodiment, a method for fabricating a light source module includes: stacking an insulating layer on a surface of a heat sink; providing a metal junction face including at least one unevenness in the insulating layer; providing a conductive layer on only the metal junction face; and mounting a light source on the conductive layer. Accordingly, it is possible to obtain various effects of the present disclosure.

The providing of the conductive layer is performed at least once using a plating process.

The mounting of the light source to the conductive layer is preferably made by bonding.

The surface of the metal junction face is preferably rough or has a metal core formed therein.

The providing of the conductive layer is performed at least once using a plating process.

The insulating layer may be stacked on the entire surface of the heat sink.

The light source module according to the present disclosure is used in light emitting devices, thereby exhibiting industrially excellent performance.

The details of one or more embodiments are set forth in the accompanying drawings and the description below. Other features will be apparent from the description and drawings, and from the claims.

DETAILED DESCRIPTION OF THE EMBODIMENTS

Hereinafter, exemplary embodiments will be described in detail with reference to the accompanying drawings. The technical objective of embodiments is not limited to the aforementioned technical problem, and technical problems not mentioned above can be clearly understood by a person skilled in the art by the disclosure below.

Figure 1:
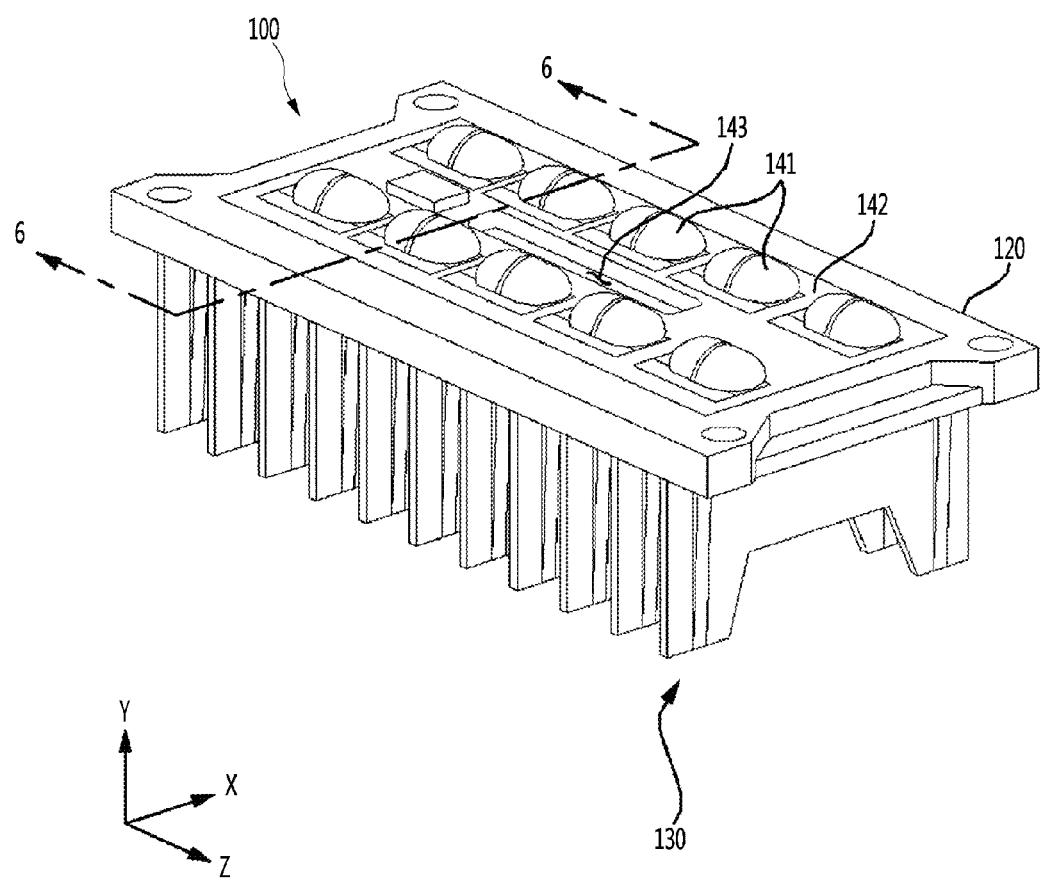
FIG. 1 is a perspective view of a light source module according to an embodiment.
Figure 2:
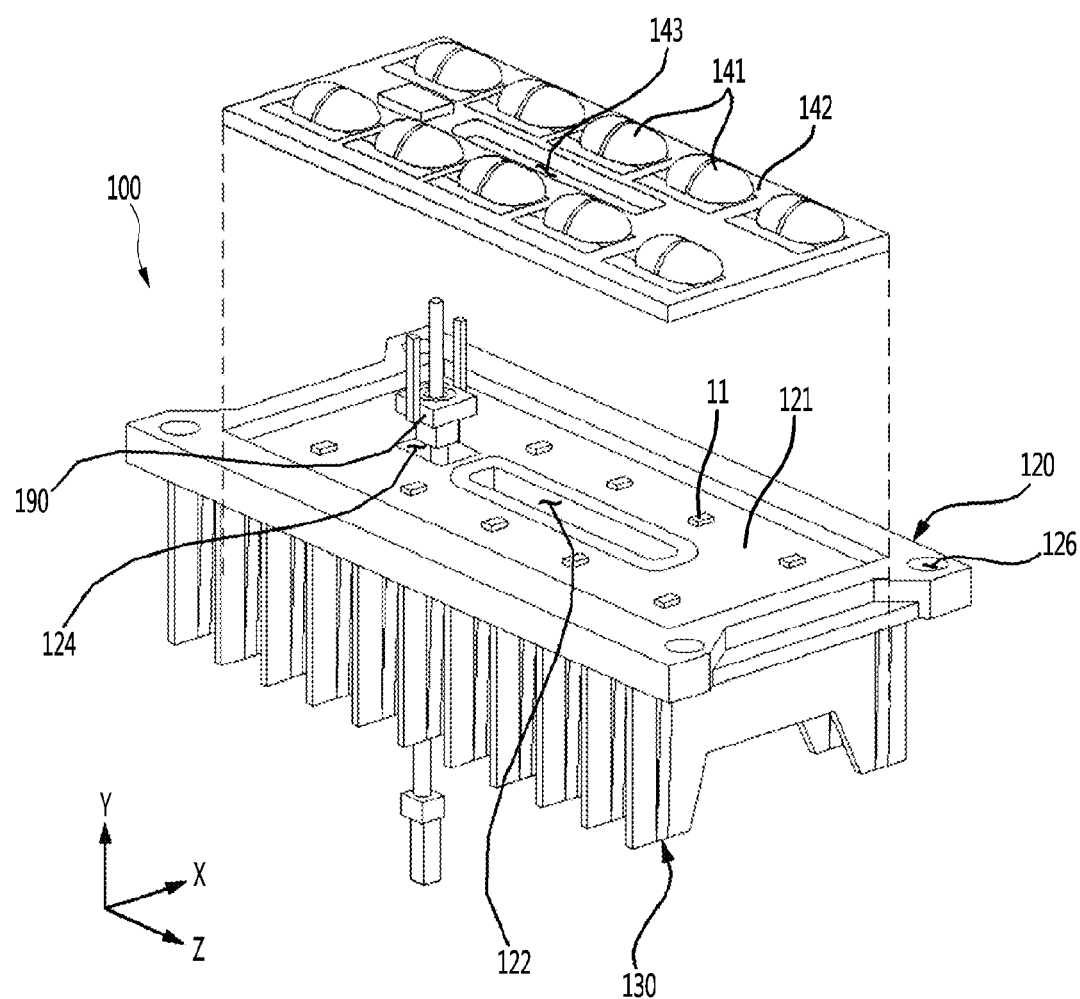
FIG. 2 is an exploded perspective view of the light source module.

FIG. 1 is a perspective view of a light source module according to an embodiment. FIG. 2 is an exploded perspective view of the light source module.

Referring to FIGS. 1 and 2, the light source module 100 according to the embodiment may include at least one light source 11 generating light and a body supporting the light source 11.

The light source 11 may include all means that generate light by being supplied with electric energy. For example, the light source 11 may include a light source in the form of a point light source. Specifically, the light source 11 may include any one of a light emitting diode and a laser diode. In the light source 11, a plurality of point light sources emitting light of different colors may be disposed adjacent to each other such that the colors are mixed with each other, thereby emitting light of white or another color.

The body is provided as a part that allows the light source 11 to perform a physical electrical action, so that the light source 11 can be stably operated. The body enables heat generated by the light source 11 to be effectively dissipated. The body is electrically connected to the light source 11 to supply power to the light source 11.

The body may include a heat sink 120. The light source 11 may be fastened to the heat sink 120 through the medium of another member, or may be directly fastened to the heat sink 120. Preferably, the light source 11 may be fastened to the heat sink 120 for the purpose of physical coupling such as support of the weight thereof. However, in order to insulate between the light source 11 and the heat sink 120, the light source 11 may be fastened to the heat sink 120 with a predetermined insulating layer interposed therebetween.

A mounting part 121 on which the light source 11 is mounted may be provided on one surface of the heat sink 120. The mounting part 121 allows heat generated by the light source 11 to be rapidly absorbed into the heat sink 120. When a heat dissipation fin 130 is connected to the opposite surface of the heat sink 120, the heat sink 120 may transfer, to the heat dissipation fin 130, heat generated by the light source 11 and heat generated by light emitted from the light source 11. It will be apparent that the heat dissipation fin 130 may rapidly dissipate heat to the outside. Also, the heat sink 120 may rapidly dissipate heat to the outside.

The heat sink 120 may be formed of a metal or resin material having excellent heat radiation and heat transfer properties, but the present disclosure is not limited thereto. As an example, the heat sink 120 may be an alloy made of one or two or more selected from the group consisting of aluminum (Al), gold (Au), silver (Ag), copper (Cu), nickel (Ni), tin (Sn), zinc (Zn), tungsten (W), and iron (Fe). As another example, the heat sink 120 may be formed of at least one selected from the group consisting of a resin material such as polyphthalamide (PPA), silicon (Si), aluminum nitride (AlN), photo sensitive glass (PSG), polyamide9T (PA9T), syndiotactic polystyrene (SPS), a metal material, sapphire ($Al_2O_3$), beryllium oxide (BeO), and ceramic. The heat sink 120 may be formed through injection molding, etching, etc., but the present disclosure is not limited thereto.

The heat sink 120 has a plate shape, and may be provided with a quadrangular planar shape. Specifically, the mounting part 121 may be formed by recessing one surface (e.g., an upper surface) of the heat sink 120. A lens cover 142 may be mounted on the mounting part 121. The mounting part 121 may be provided with a waterproof structure with the outside by the lens cover 142. The light source 11 can be waterproofed against the external environment by coupling between the mounting part 121 and the lens cover 142.

A fastening hole 126 may be formed at an edge of the heat sink 120. When the light source module 100 is coupled to a lighting device, a fastening member passes through the fastening hole 126.

The body may include the heat dissipation fin 130 for further improving the heat dissipation efficiency of the heat sink 120. The heat dissipation fin 130 may have a shape in which the area of the heat dissipation fin 130 contacted with air is maximized. The heat dissipation fin 130 is transferred with heat of the heat sink 120 to be heat-exchanged with external air. Specifically, the heat dissipation fin 130 may be provided in the shape of a plurality of plates further extending downward from the other surface (bottom surface) of the heat sink 120. More specifically, the heat dissipation fin 130 may be disposed in plurality with a predetermined pitch. In addition, the width of the heat dissipation fin 130 may be formed in a region equal or similar to the width of the heat sink 120 such that the heat dissipation fin 130 can be effectively transferred with heat of the heat sink 120. The heat dissipation fin 130 may be formed with the heat sink 120 as a single body, or may be fabricated as a separate component part. The heat dissipation fin 130 may include a material having excellent heat transfer efficiency, e.g., at least one selected from the group consisting of aluminum (Al), nickel (Ni), copper (Cu), silver (Ag), and tin (Sn). Preferably, the heat dissipation fin 130 may be integrally formed with the heat sink 120 using the same material.

Figure 3:
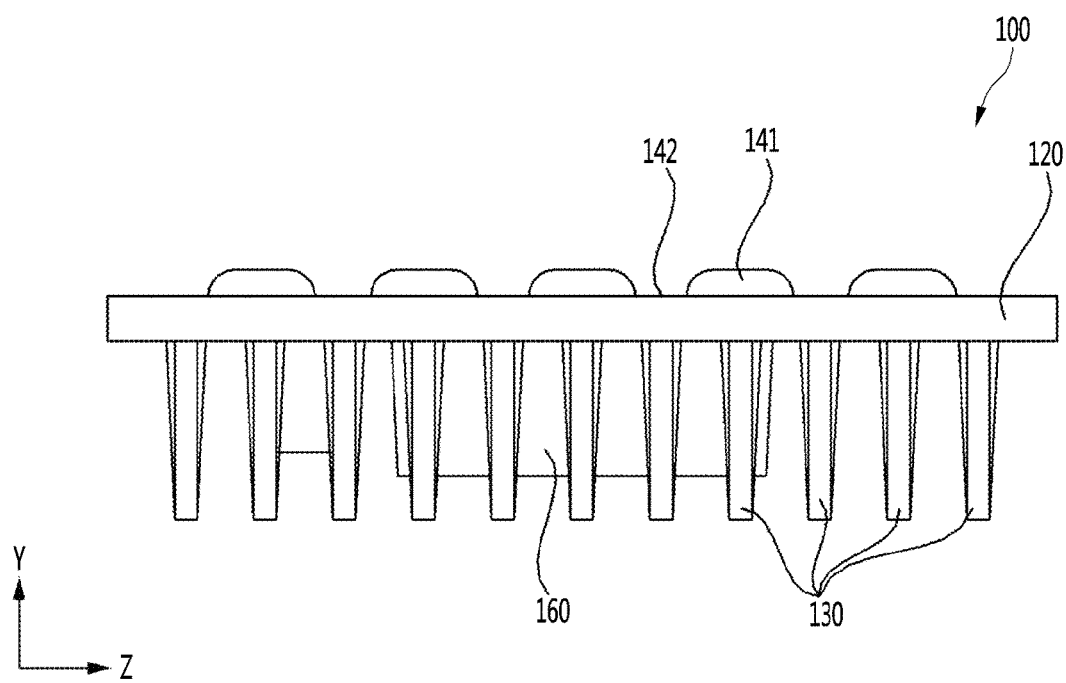
FIG. 3 is a front view of the light source module.
Figure 4:
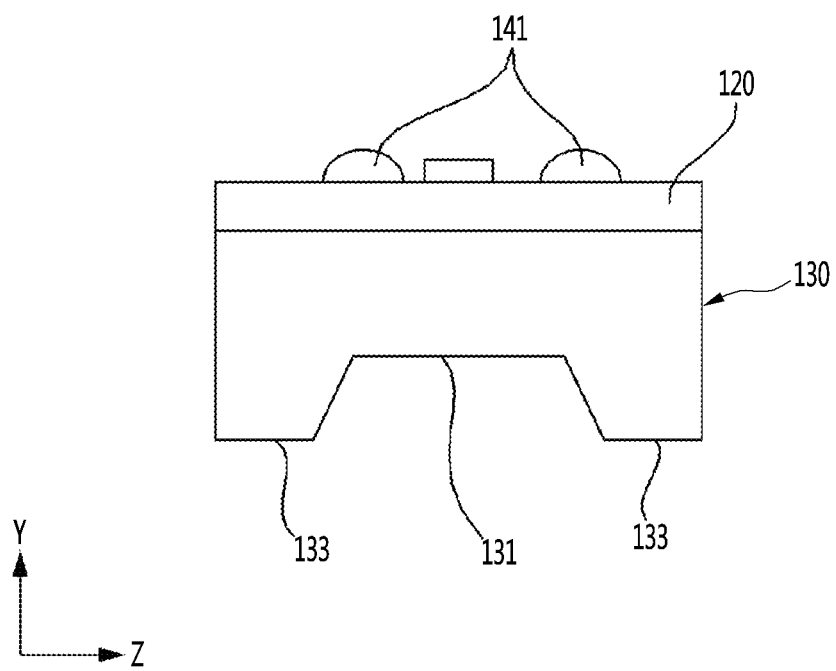
FIG. 4 is a side view of the light source module.

FIG. 3 is a front view of the light source module. FIG. 4 is a side view of the light source module.

Referring to FIGS. 3 and 4, the heat dissipation fin 130 may be disposed long in the width direction (the direction of a short edge) of the heat sink 120. Also, the heat dissipation fin 130 may be disposed in plurality with a predetermined pitch in the length direction (the direction of a long edge) of the heat sink 120. A central portion 131 of the heat dissipation fin 130 may be further depressed toward the heat sink 120 than both end portions 133 of the heat dissipation fin 130. The light sources 11 may be positioned to respectively overlap both the end portions 133 in the vertical direction. Both the end portions 133 of the heat dissipation fin 130 may be formed higher than the central portion 131 of the heat dissipation fin 130. Accordingly, a portion to which heat of a high temperature is transferred among several portion of the heat dissipation fin 130 can be contacted with a larger amount of air, thereby further improving heat dissipation efficiency. Further, the central portion 131 of the heat dissipation fin 130 enables fabrication cost to be saved.

An air hole 122 (see FIG. 2) may be formed in the heat sink 120. The air hole 122 may be formed to vertically pass through the heat sink 120. Specifically, the air hole 122 may be formed to pass through the heat sink 120 toward the heat dissipation fin 130 from the mounting part 121. According to the above-described configuration, a space in which air flows can be provided. The air hole 122 may be formed long in the length direction of the heat sink 120 at a central portion of the heat sink 120. The air hole 122 may communicate with a cover hole 143 (see FIGS. 1 and 2) formed in the lens cover 142 while overlapping the cover hole 143 in the vertical direction.

The light sources 11 may be positioned at the periphery of the air hole 122. Specifically, the light sources may be disposed adjacent to the air hole 122 on the one surface of the heat sink 120, which forms the periphery of the air hole 122. Therefore, the air hole 122 may be first heated by heat generated by the light sources 11. The air hole 122 may allow air to be circulated by a temperature difference between the inside and outside of the air hole 122. The circulated air may accelerate cooling of the heat dissipation fin 130 and the heat sink 120. Specifically, the air hole 122 may be positioned to vertically overlap the central portion 131 of the heat dissipation fin 130. The light sources 11 may be positioned to respectively overlap both the end portions of the heat dissipation fin 130.

Figure 5:
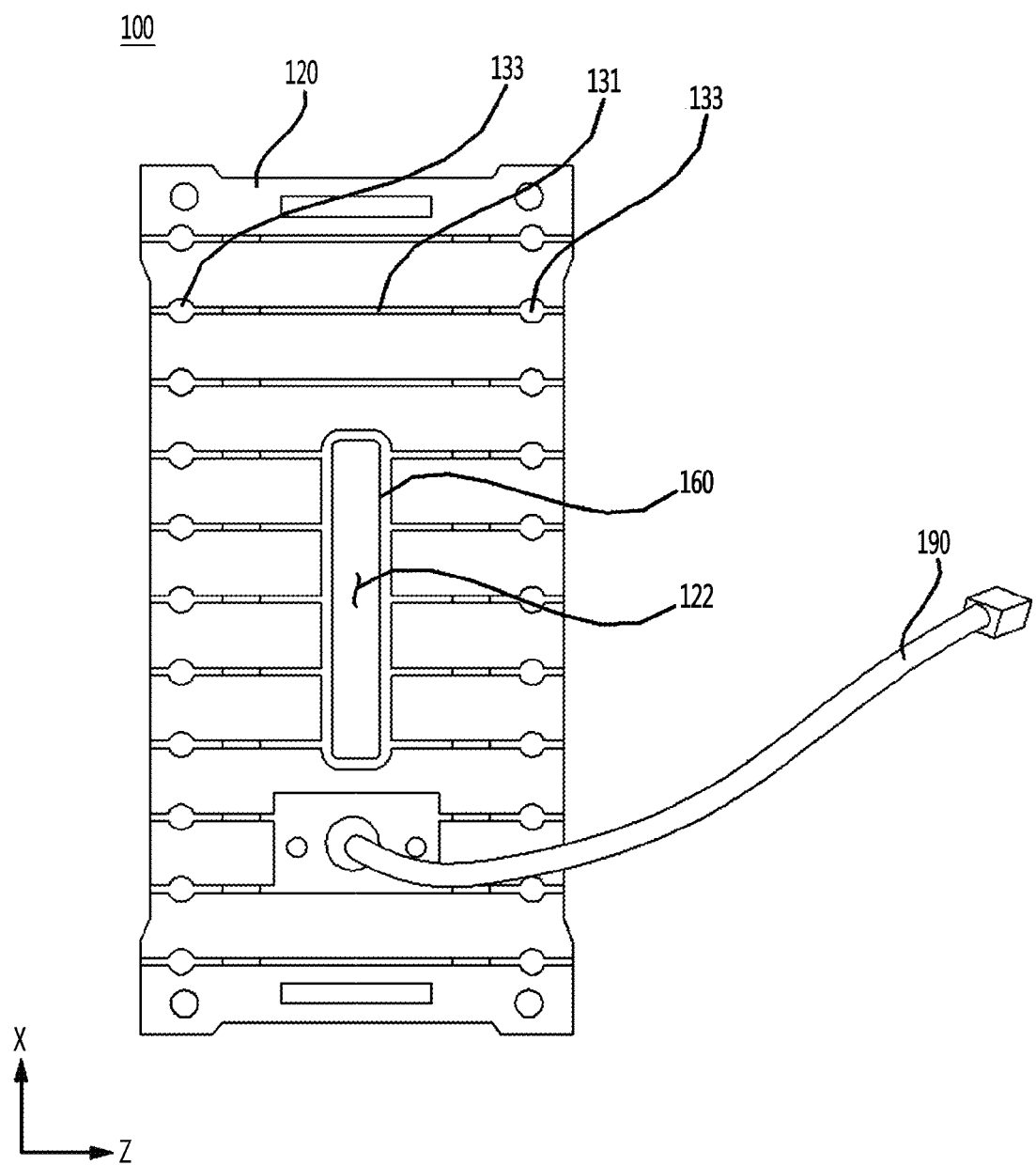
FIG. 5 is a bottom view of the light source module.

FIG. 5 is a bottom view of the light source module.

Referring to FIG. 5, the light source module 100 may further include an air guiding part 160 extending downward of the heat sink 120 from the circumference of the air hole 122, the air guiding part 160 communicating with the air hole 122 to guide air. (Herein, the term "downward" assumes that the light source is at the top side, and the heat dissipation fins are on the bottom side of the light source module. In general, the air guiding part extends from the side carrying the light source to the side having the heat dissipation fins, irrespective of the final orientation of the light source module). The air guiding part 160 may be formed in the shape of a cylinder having a space therein. That is, the circumference of the air guiding part 160 may be configured to overlap the circumference of the air hole 122. In other words, the air guiding part 160 may be formed in the shape of a chimney surrounding the air hole 122. The section of the air guiding part 160 may be formed in the shape of an approximately rectangle. In addition, each corner of the rectangle may be curved.

The air guiding part 160 may be made of a material having excellent heat transfer property. For example, the air guiding part 160 may include at least one selected from the group consisting of aluminum (Al), nickel (Ni), copper (Cu), silver (Ag), and tin (Sn). Also, the air guiding part 160 may be formed of at least one selected from the group consisting of a resin material such as polyphthalamide (PPA), silicon (Si), aluminum nitride (AlN), photo sensitive glass (PSG), polyamide9T (PA9T), syndiotactic polystyrene (SPS), a metal material, sapphire (Al2O3), beryllium oxide (BeO), and ceramic. The air guiding part 160 may be integrally formed with the heat sink 120 and the heat dissipation fin 130 through the same process using the same material.

The outer surface of the air guiding part 160 may be connected to at least portions of a plurality of heat dissipation fins 130. Also, the outer surface of the air guiding part 160 may transfer, to the air guiding part 160, heat transferred from the light source 11 to the heat sink 120 and the heat dissipation fin 130. The air guiding part 160 may further accelerate the air flowing into the air hole 122. In addition, a connector hole (see 124 of FIG. 2) through which a connector 190 supplying power to the light source 11 passes may be formed in the heat sink 120.

Figure 6:
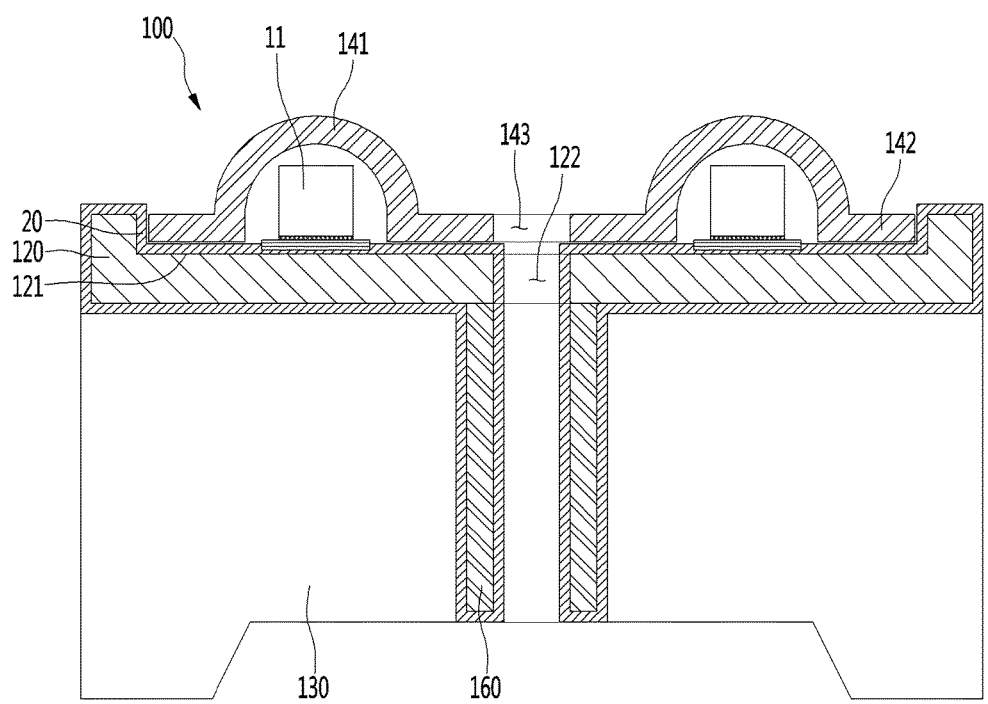
FIG. 6 is a sectional view taken along line 6-6 of FIG. 1.

FIG. 6 is a sectional view taken along line 6-6 of FIG. 1. FIG. 6 is a sectional view taken along a portion at which the light sources 11 are placed, specifically, a portion at which power is applied to the light sources 11.

Referring to FIG. 6, an electrically insulating layer may be formed on a surface of the heat sink 120. The insulating layer 20 may be formed on the entire surface of the heat sink 120. However, the present disclosure is not limited thereto, and the insulating layer 20 may be formed on only a portion of the entire surface. When the heat dissipation fin 130 and the air guiding part 160 is formed with the heat sink 120 as a single body, the insulating layer 20 may also be formed on surfaces of the heat dissipation fin 130 and the air guiding part 160. In this case, the insulating layer 20 may be formed on the entire surface of each component part, and may be formed on only a portion of the entire surface.

According to an embodiment, the heat sink 120, the heat dissipation fin 130, and the air guiding part 160 may be provided together by a die-casting technique, and the insulating layer 20 may be then provided.

The insulating layer 20 may be applied by a powder coating technique. The powder coating technique may be any one of an electrostatic spray technique, an electrostatic brush technique, and a fluidized bed technique. Therefore, the insulating layer 20 may be referred to as a coated insulating layer or applied insulating layer. Accordingly, a process can be rapidly and inexpensively performed, and the yield of products can be improved. According to this technique, the insulating layer 20 may be provided as a thin film. Thus, the efficiency of heat dissipated to the heat sink 120 is improved.

The insulating layer 20 may electrically (but not thermally) insulate between the heat sink 120 and a conductive layer 40 which will be described later. The conductive layer 40 has electrical conductivity and hence may be electrically connected to the light source 11. The conductive layer 40 may be a path through which electric current is applied to the light source 11. Also, the conductive layer 40 may have a function of rapidly diffusing heat. To this end, the conductive layer 40 may be made of a metal material. For example, the conductive layer 40 may be provided as a single layer or as a stack of multiple layers, including at least one selected from the group consisting of Ag, Au, Cu, and Ni. Here, the oxidation of the Ag and Au can be prevented even when the Ag and Au are exposed to the outside, and hence the conductive layer 40 may be used as the outermost layer. This is equally applied to embodiments.

The light source 11 may be provided as a vertical light emitting diode including two electrodes formed downwardly. In FIG. 6, it is illustrated that one electrode is connected to the light source 11, and it can be easily expected that the other electrode will be provided under or above the ground. If the vertical light emitting diode is mounted on the conductive layer 40, separate wire bonding is not required.

The conductive layer 40 may be provided in a recess part 21 previously formed at a position at which the conductive layer 40 is to be provided. The recess part 21 may be formed by etching the insulating layer 20 through laser direct structuring (LDS). The recess part 21 may be formed into a structure in which at least the bottom surface in its internal region has a rough surface including a metal core. The recess parts 21 may be provided to be spaced apart from each other with respect to the conductive layers 40 connected to the light source 11. In other words, a pair of conductive layers 40 to provide a pair of electrodes may be placed inside different recess parts 21, to prevent a short circuit between the electrodes connected to the light source 11.

The conductive layer 40 may be provided in the recess part 21, to thereby form circuit patterns interconnecting the light sources 11 to the connector hole 124. The conductive layer 40 may be formed by repeatedly performing a plating process at least twice. According to an embodiment, in the conductive layer 40, Cu, Ni, and Au may be sequentially stacked to respectively provide a first plating layer 41, a second plating layer 42, and a third plating layer 43, which will be described later. With this configuration, heat generated by the light sources 11 transfers easily through the conductive layer 40 and the recess part 21 of the insulating layer 20 to reach the heat sink 120.

The method of providing the insulating layer 20, the recess part 21, and the conductive layer 40 may be performed by forming a conductive film on the insulating layer through techniques such as sputtering and electrolytic/electroless plating using a conductive material such as copper and then etching the conductive film. In this case, the recess part 21 may be previously provided in the insulating layer 20 so as to prevent a short circuit, etc. However, the present disclosure is not limited thereto, and the LDS may be performed. This is because fabrication cost is inexpensive, a process can be rapidly and precisely performed, and mass production can be achieved using laser equipment.

The light source module 100 may further include a plurality of lenses 141 that shield the light sources 11 and refract light generated by the light sources 11. The lens 141 may diffuse light generated by the light source 11. The lens 141 may determine the diffusion angle of light generated by the light source 11 according to its shape. For example, the lens 141 may be molded in a concave shape around the light source 11. Specifically, the lens 141 may include a material allowing light to be transmitted therethrough. For example, the lens 141 may be formed of transparent silicon, epoxy, or another resin material. In addition, the lens 141 may surround the light source to protect the light source 11 from external moisture and impact and to isolate the light source 11 from the outside.

More specifically, for convenience of assembly, the lens 141 may be provided to the lens cover 142 formed corresponding to the insulating layer 20. The lens cover 142 may be formed to correspond to the insulating layer 20 on the top surface of the insulating layer 20. The lens 141 positioned at the lens cover 142 may be disposed at a position overlapping the light source 11. The lens cover 142 may be inserted and mounted into the mounting part 121 to waterproof the light source 11 from the outside.

The cover hole 143 communicating with the air hole 122 may be formed in the lens cover 142. Specifically, the cover hole 143 may be formed to vertically pass through the lens cover 142 at the center of the lens cover 142.

The insulating layer 20 may include a material capable of efficiently reflecting light. In this case, light emitted from the light source 11 and light reflected from the lens cover 142 including the lens 141 are again reflected to the outside, thereby further improving the use efficiency of light. Further, light lost as heat is reduced, thereby achieving high cooling efficiency.

Hereinafter, a method of providing the insulating layer, the recess part, and the conductive layer, which is included in embodiments, will be described in detail.

Figure 7:
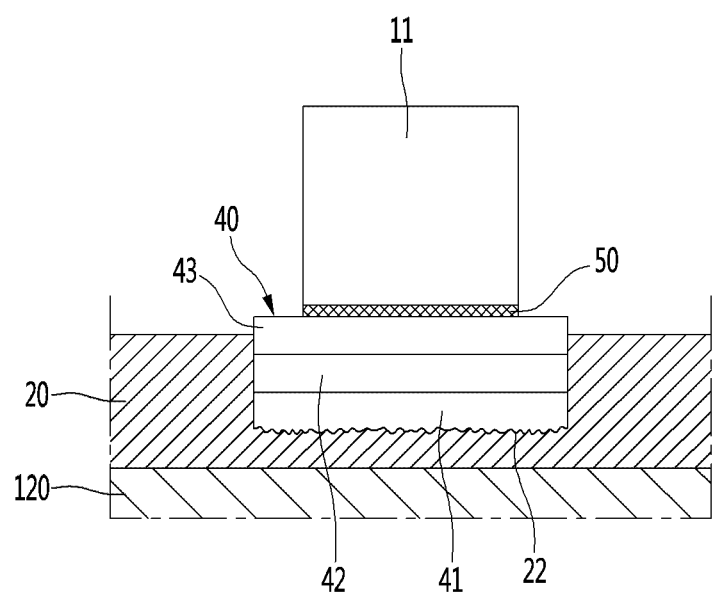
FIG. 7 is an enlarged view of a portion at which a light source is placed in FIG. 6.

FIG. 7 is an enlarged view of a portion at which the light source is placed in FIG. 6.

Referring to FIG. 7, a metal junction face 22 may be processed in an inner surface of the recess part 21. The metal junction face 22 may refer to a surface of the insulating layer 20 that is processed as a surface having an appropriate property in which the conductive layer 40 is stacked thereon. The metal junction face 22 may be formed by irradiating laser onto a region of the insulating layer 20 in which the conductive layer 40 is to be provided.

The metal junction face 22 may be provided with a metal core with which a metal of the conductive layer 40 can be joined. The surface of the metal junction face 22 may be processed as a lattice-shaped trench. The metal junction face 22 may include at least the bottom surface of the recess part 21. The trench may be irregularly provided. The metal core is provided to the insulating layer 20, so that it is possible to promote heat transfer through the insulating layer 20. This will be described below in detail. Thus, according to the invention, an insulating layer is contacted with the heat sink, a conductive layer is contacted with the insulating layer, and a metal junction face is provided at a surface where the insulating layer and the conductive layer are contacted with each other, and such structure improves heat dissipation efficiency.

The conductive layer 40 may be stacked on the metal junction face 22. At least one plating layer may be stacked in the conductive layer 40. For example, the conductive layer 40 may include the first plating layer 41 made of copper, the second plating layer 42 made of nickel, and the third plating layer 43 made of gold or silver. The first plating layer 41 may be stacked to a thickness of 10 to 20 μm. The second plating layer may be stacked to a thickness of 5 to 15 μm. The third plating layer 43 may be stacked to a thickness of 0.1 μm or so. The third plating layer 43 may cause an increase in material cost. Therefore, the third plating layer 43 may not be stacked. However, the third plating layer 43 may be provided as a thin film for anti-oxidation and protection.

The first plating layer 41 placed at the lowermost side of the conductive layer 40 serves as an electroconductive functional layer that can reduce the amount of heat generation by reducing electrical resistance. To this end, the first plating layer 41 may be made of copper. In order to ensure sufficient electrical conductivity, the first plating layer 41 may be formed thickest among the plating layers. The first plating layer 41 may be made of a metal having a high electrical conductivity as well as the copper.

The second plating layer 42 placed in the middle of the conductive layer 40 serves as a soldering functional layer that improves the quality of soldering. In order to perform soldering, it is necessary for a melted solder to be well wettable on the entire surface of a base material and to be well spread on the surface of the base material. The second plating layer 42 may be made of nickel as a metal for ensuring characteristics of the soldering.

The third conductive layer 43 placed at the uppermost side of the conductive layer 40 serves as a protective functional layer for protecting the plating layers 41 and 42 thereinside. The third plating layer 43 may be made of gold that is not oxidized or discolored. In the case of silver, the silver may produce a discolored LED package. Also, the silver may penetrate into an LED package and chemically react with internal component parts of a light emitting part, thereby degrading light emitting efficiency. Since the third plating layer 43 performs a function of protection, the third plating layer 43 may be provided as the thinnest layer. The second plating layer 42 may be not provided, and only the third plating layer 43 may be provided, but this is not preferable in terms of cost. Since the third plating layer is provided as a considerably thin layer, the third plating layer 43 does not interfere with the function of the second plating layer 42 in the soldering.

The third plating layer 43 may be provided as resin. In this case, the resin may be stacked through another technique instead of a plating technique. The resin is not covered at a portion on which the soldering is performed, so that the soldering cannot be interfered with by the resin.

A bonding layer 50 may be provided on the conductive layer 40. The light source 11 may be placed on the bonding layer 50. The bonding layer 50 may include a low-temperature solder paste with which soldering can be performed at a low temperature. For example, the bonding layer 50 may include OM525. The bonding layer 50 may be provided by allowing the low-temperature solder paste to pass through a reflow machine in a state in which a light emitting device is mounted on the low-temperature solder paste. The soldering is performed at the low temperature, so that it is possible to prevent separation between two of the heat sink 120, the insulating layer 20, and the conductive layer 40. Accordingly, it is possible to improve the reliability and yield of products can be improved and to prevent the deterioration of a material, caused by long-term use.

FIGS. 8 to 12 are views sequentially illustrating a fabrication method of the light source module.

Figure 8:
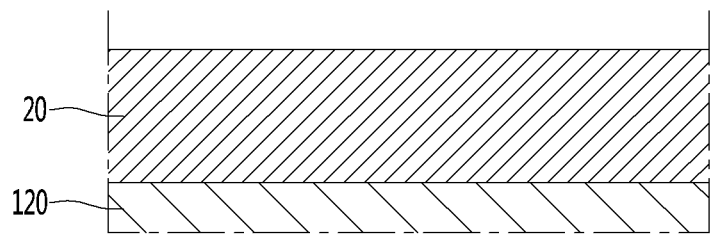
FIGS. 8 to 12 are views sequentially illustrating a fabrication method of the light source module.

Referring to FIG. 8, the insulating layer 20 may be provided to a body 120 fabricated by, for example, a die-casting technique. The insulating layer 20 may be applied by a powder coating technique. The insulating layer 20 may be molded using a material including resin and then provided as a resin molded article. More specifically, the powder coating technique may be any one of an electrostatic spray technique, an electrostatic brush technique, and a fluidized bed technique. Therefore, the insulating layer 20 may be referred to as a coated insulating layer or applied insulating layer. The thickness of the coated insulating layer may be 60 to 80 μm. However, the thickness is not limited thereto, and may be selected to have various dimensions according to insulation performance, heat dissipation performance, and process variables. In an embodiment, a condition may be found in which, when the light source 11 is a light emitting diode, is connected to a commercial power source, and is used suitable for external environment, the insulation and heat dissipation of the insulating layer 20 can be ensured, and the providing of the insulating layer 20 can be performed through an inexpensive process.

The LDS may be applied to the insulating layer 20 such that the conductive layer 40 is stacked on at least one portion of the surface of the insulating layer 20. The LDS is a process performed before a plating process, and may be performed by irradiating laser onto a region in which the conductive layer 40 is to be plated on the surface of the insulating layer 20. A plating target region on the surface of the resin molded article is reformed by the laser, to have a property suitable for plating. To this end, the insulating layer 20 may contain a 'core generating agent for LDS' (hereinafter, simply referred to as a 'core generating agent') capable of forming a metal core by means of laser, or may have a predetermined pattern formed therein such that a plating layer is provided at the inner surface of the recess part 21.

First, a case where the insulating layer 20 contains a core generating agent will be described.

A core generating agent may be contained in the resin molded article forming the insulating layer 20. If laser is irradiated onto the core generating agent, a metal core may be generated as the core generating agent is decomposed. In addition, a plating target region onto which the laser is irradiated may have a surface roughness. The plating target region reformed by the laser can be suitable for plating due to the metal core and the surface roughness. The metal core may mean a core with which a metal is joined in a subsequent plating process.

The core generating agent may include a metal oxide having a spinel, a heavy metal composite oxide spinel such as copper chromium oxide spinel, a copper salt such as copper hydroxide phosphate, copper phosphate, copper sulfate, or cuprous thiocyanate, and the like. A polyester-based resin may be used as a material of the insulating layer 20. This is because the polyester-based resin can obtain better adhesion with a metal. Thus, it is possible to prevent separation between two of the heat sink 120, the insulating layer 20, and the conductive layer 40, which may be caused by heat applied in a bonding process of the light source 11 as a subsequent process.

Next, a case where a predetermined pattern is formed in the inner surface of the recess part 21. Although the resin molded article forming the insulating layer 20 does not contain the core generating agent, the conductive layer 40 may be formed by forming a trench line in a predetermined pattern, e.g., a lattice pattern in the plating target region. The trench line may effectively promote the joining of a metal with the plating target region on the surface of the resin molded article, and may allow the plating process to be performed. The trench line may be provided with at least two kinds of trenches intersecting each other.

The forming of the trench line in the predetermined pattern may be performed by irradiating laser onto the plating target region on the surface of the insulating layer 20.

Figure 9:
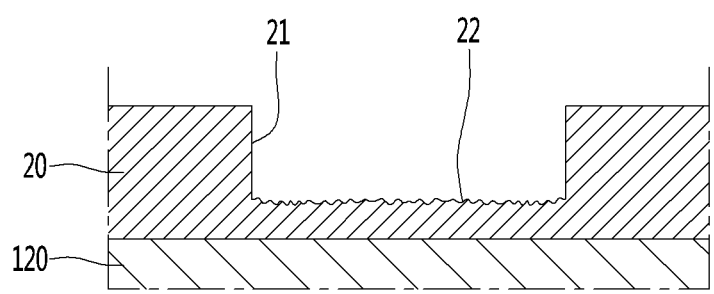

FIG. 9 is a view illustrating that the recess part is provided in the insulating layer.

Referring to FIG. 9, as described above, laser may be used as a means for providing the recess part 21 in the insulating layer 20. In this case, a medium providing the laser may include, for example, yttrium aluminum garnet (YAG), yttrium orthovanadate ($YVO_4$), ytterbium (YB), $CO_2$, etc. The wavelength of the laser may be, for example, 532 nm, 1064 nm, 1090 nm, 9.3 μm, 10.6 μm, etc. An algorithm in which processing is performed by recognizing a three-dimensional shape may be used while processing is performed using the laser. For example, a method may be applied in which the processing height of the laser is controlled by recognizing the body including at least the heat sink 120 as a three-dimensional recognition program and separating the body into several levels on the basis of the height of the body. The laser may have, for example, an output value of about 2 W to about 30 W.

As described above, the metal junction face 22 processed by the laser has at least one of a metal core, a rough surface, and a trench, so that the conductive layer 40 can be plated in a subsequent process.

Figure 10:
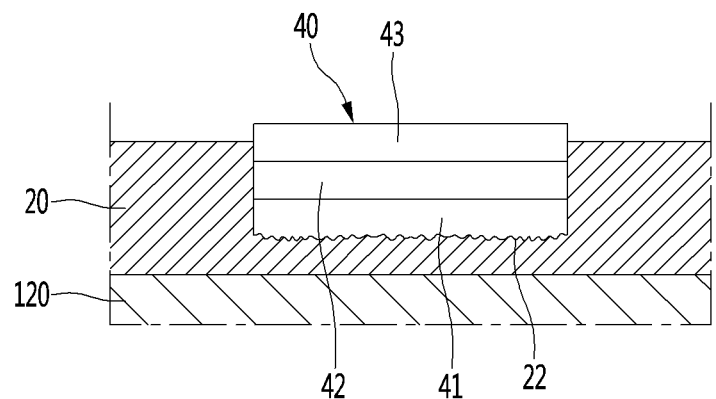

FIG. 10 is a view illustrating that the conductive layer is provided in the recess part. In the example shown in FIG. 10, the conductive layer 40 has three stacked layers 41, 42, and 43.

Referring to FIG. 10, the conductive layer 40 may be provided by plating a metal on the metal junction face 22 using an electroless process. It will be apparent that another plating process may be performed. The conductive layer 40 may be copper, nickel, gold, silver, or a combination thereof. The conductive layer 40 may be a single-layered or stacked structure. In the stacked structure, layers may be the same metal or different metals. In an embodiment, layers of copper, nickel, and gold may be sequentially stacked to have a three-layer structure.

As an embodiment, a case where the first plating layer 41 made of copper is provided will be described in detail.

The heat sink 120 providing the metal junction face 22 is immersed in an electroless copper plating solution. In this case, the heat dissipation fin 130 and the air guiding part 160 may be immersed together with the heat sink 120. For example, an aqueous plating solution for electroless copper may contain about 55 ml to about 65 ml of a copper dry bathing/supplementing agent, about 55 ml to about 65 ml of an alkaline supplementing agent, about 15 ml to about 20 ml of a complexing agent, about 0.1 ml to about 0.2 ml of a stabilizing agent, and about 8 ml to about 10 ml of formaldehyde, based on deionized water.

The copper dry bathing/supplementing agent may contain, for example, about 6 parts by weight to about 12 parts by weight of copper sulfate, about 1 part by weight to about 1.5 parts by weight of polyethylene glycol, about 0.01 part by weight to about 0.02 part of weight of the stabilizing agent, and about 78 parts by weight to about 80 parts by weight of water.

The alkaline supplementing agent may contain, for example, about 40 parts by weight to about 50 parts by weight of sodium hydroxide, about 0.01 part by weight to about 0.02 part by weight of the stabilizing agent, and about 50 parts by weight to about 60 parts by weight of the water.

The complexing agent may contain, for example, about 49 parts by weight to about 50 parts by weight of the sodium hydroxide, about 0.01 part by weight to about 0.02 part by weight of the stabilizing agent, and about 50 parts by weight to about 51 parts by weight of the water.

The stabilizing agent may contain, for example, about 0.2 part by weight to about 0.3 part by weight of potassium selenocyanate, about 5 parts by weight to about 6 parts by weight of potassium cyanide, about 0.3 part by weight to about 0.4 part by weight of the sodium hydroxide, and about 92 parts by weight to about 93 parts by weight of the water.

For example, in order to provide the first plating layer 41 made of copper, a resin molded article provided with a catalyst may be immersed at a deposition speed of about 0.5 to about 0.7 μm/10 min in the electroless copper solution at about 41° C. to about 55° C. and then washed by water.

After that, a plating process may be further performed by repeatedly providing another plating layer in a plating solution.

The conductive layer 40 may be stacked up to a range exceeding the depth of the recess part 21. Accordingly, the resistance of the conductive layer 40 can be reduced by increasing the area of the conductive layer 40 to which electric current is applied, and thus the amount of heat generated by the resistance can be reduced. It will be apparent that the present disclosure is not limited to the above-described configuration.

Figure 11:
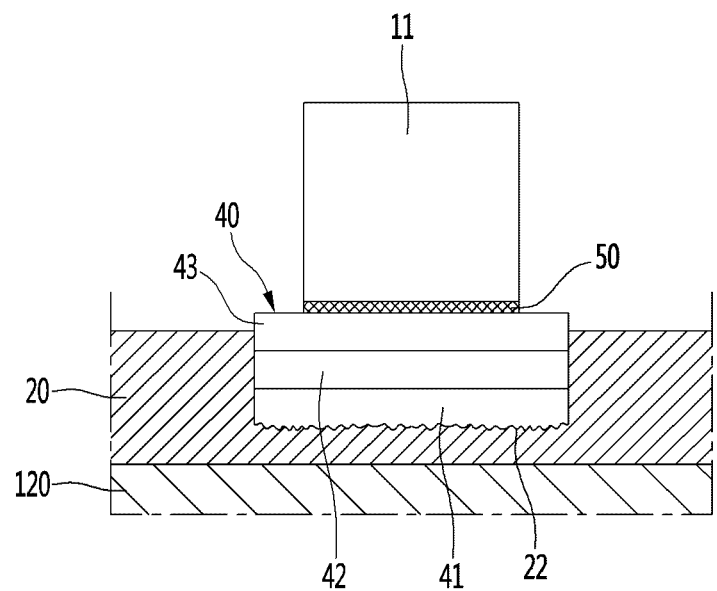

FIG. 11 is a view illustrating that the bonding layer is provided.

Referring to FIG. 11, the bonding layer 50 may be provided by applying a low-temperature solder paste on the conductive layer 40, mounting the light source 11 at a position at which the electrodes of the light source 11 are aligned on the low-temperature solder paste, and then allowing the low-temperature solder paste to pass through a reflow machine. In the reflow process, an unnecessary portion is removed from the low-temperature solder paste, and a conductive element remains, so that the conductive layer 40 and the light source 11 can be electrically connected to each other.

The low-temperature solder paste may include OM525 available at about 160° C. Since a relatively low temperature atmosphere is formed in the reflow process, it is possible to prevent separation between the insulating layer 20 and the heat sink 120 and separation between the conductive layer 40 and the insulating layer 20. Accordingly, it is possible to improve the yield and reliability of products.

Figure 12:
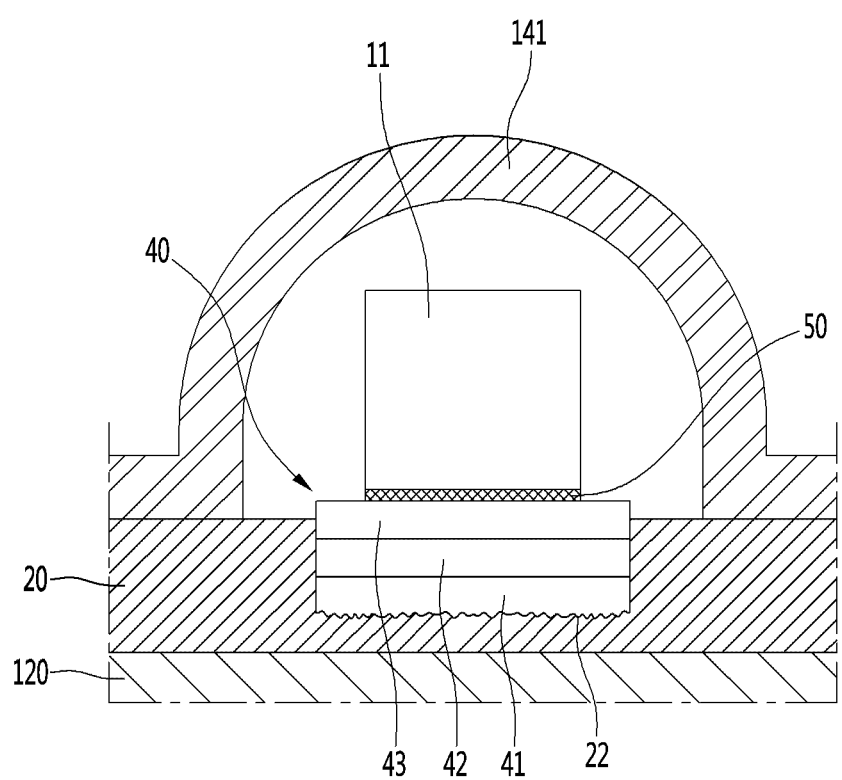

FIG. 12 is a view illustrating that the lens 141 is further provided over the light source.

The lens 141 is provided over the light source 11. The lens 141 shields the light source 11, and may refract and diffuse light generated by the light source 11. The lens 141 may determine the diffusion angle of light generated by the light source 11 according to its shape. For example, as shown in FIG. 12, the lens 141 is molded in a concave shape around the light source 11. Specifically, the lens 141 includes a material allowing light to be transmitted therethrough. For example, the lens 141 may be formed of transparent silicon, epoxy, or another resin material. In addition, the lens 141 may fully surround the light source to protect the light source 11 from external moisture and impact and to isolate the light source 11 from the outside.

More specifically, for convenience of assembly, the lens 141 may be provided to the lens cover 142 (shown in FIG. 6) formed corresponding to the insulating layer 20. The lens cover 142 may be formed to correspond to the insulating layer 20 on the top surface of the insulating layer 20. The lens 141 positioned at the lens cover 142 may be disposed at a position overlapping the light source 11. The lens cover 142 may be mounted inside the mounting part 121 to waterproof the light source 11 from the outside.

Figure 13:
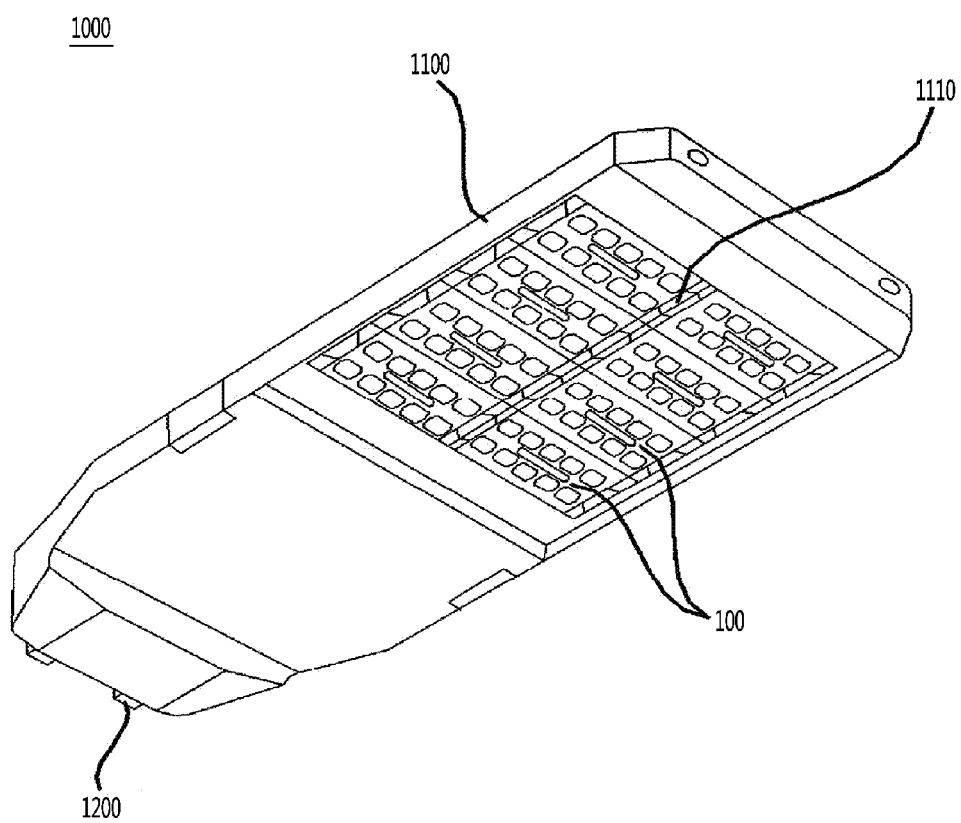
FIG. 13 is a perspective view of a lighting device including light source modules according to an embodiment.

FIG. 13 is a perspective view of a lighting device including light source modules according to an embodiment.

Referring to FIG. 13, the lighting device 1000 according to the embodiment shown includes a main body 1100 providing a space in which lighting modules 100 are coupled thereto, the main body 1100 forming an external appearance, and a connection part 1200 having a built-in power source (not shown) coupled to one side of the main body 1100 to supply power, the connection part 1200 connecting the main body 1100 to a supporting part (not shown). The lighting device 1000 according to the embodiment may be installed indoors or outdoors. For example, the lighting device 1000 according to the embodiment may be used as a streetlight. The main body 1100 may be provided with a plurality of frames 1110 capable of providing a space in which at least two light source modules 100 are positioned. The connection part 1200 has the power source (not shown) built therein and connects the main body 1100 to the supporting part (not shown) fixing the main body 1100 to the outside.

If the lighting device 1000 according to the embodiment is used, heat generated by the light source modules 100 can be effectively cooled due to a chimney effect. Further, a separate fan is not used, and thus fabrication cost can be reduced.

According to the present disclosure, due to effects such as rapid fabrication processes, inexpensive fabrication cost, facilitation of mass production, and improvement of product yield, many advantages can be expected in the production of lighting devices. Particularly, products can be inexpensively fabricated at high speed. Thus, it is possible to promote the spread of lighting devices using light emitting diodes.

According to the present disclosure, an insulating layer is contacted with the heat sink, a conductive layer is contacted with the insulating layer, and a metal junction face is provided at a surface where the insulating layer and the conductive layer are contacted with each other, so that it is possible to improve heat dissipation efficiency and to inexpensively fabricate the light source module.

According to the present disclosure, a conductive layer is provided in a multi-layered structure using the same material or different metals, so that it is possible to prevent separation between the conductive layer and an insulating layer.

According to the present disclosure, a recess part is provided by processing an insulating layer using laser, and a conductive layer is stacked in the recess part, so that it is possible to improve heat dissipation efficiency and inexpensively produce the light source module in large quantities.

According to the present disclosure, an insulating layer having a first thickness region and a second thickness region thinner than the first thickness region is applied on the heat sink, and a plating layer is provided in the second thickness region, so that it is possible to inexpensively implement the light source module in large quantities.

According to the present disclosure, there are provided an insulating layer provided as a thin film on at least one surface of the heat sink and a conductive layer contacted with the insulating layer, the conductive layer providing a path through which electric current is applied, so that it is possible to implement the light source module in large quantities through simple processes.

According to the present disclosure, an insulating layer is stacked on the surface of the heat sink, a metal junction surface including at least one unevenness is provided in the insulating layer, a conductive layer is provided on the metal junction surface, and a light source is mounted on the conductive layer, so that it is possible to provide rapid fabrication processes.

That is, according to the present disclosure, it is possible to obtain effects such as rapid fabrication processes, inexpensive fabrication cost, facilitation of mass production, improvement of product yield, and promotion of heat dissipation. Furthermore, it is possible to obtain various effects that can be understood through configurations described in the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light source module comprising:
   at least one light source configured to emit light;
   a heat sink configured to absorb heat from the light source and dissipate the heat to the outside;
   an electrically insulating layer applied to at least one surface of the heat sink, the electrically insulating layer being provided as a thin film; and
   a conductive layer applied to at least one portion of the insulating layer, the conductive layer providing a path for a flow of electric current,
   wherein the light source is electrically connected to the conductive layer.

2. The light source module according to claim 1, further comprising a metal junction face provided at a surface where the conductive layer and the insulating layer are contacted with each other.

3. The light source module according to claim 2, wherein the metal junction face comprises at least one of a metal core and a trench.

4. The light source module according to claim 2, wherein the metal junction face is provided at a bottom surface of a recess part, the recess part having a side surface and a bottom surface.

5. The light source module according to claim 2, wherein the insulating layer comprises a recess part recessed inward from a top surface of the insulating layer.

6. The light source module according to claims 5, wherein the conductive layer is provided in the recess part.

7. The light source module according to claim 1, wherein the conductive layer is provided in a single layer made of a metal selected from the group consisting of copper, nickel, silver, and gold.

8. The light source module according to claim 1, wherein the conductive layer is provided by plating, in multiple layers, the same metal or different metals, selected from the group consisting of copper, nickel, silver, and gold.

9. The light source module according to claim 8, wherein copper is stacked at a lower portion of the conductive layer, and nickel is stacked at an upper portion of the conductive layer.

10. The light source module according to claim 1, wherein the conductive layer further protrudes from the top surface of the insulating layer.

11. The light source module according to claim 1, wherein a bonding layer is interposed between the light source and the conductive layer, and
   a lower-temperature solder paste is used in the bonding layer.

12. The light source module according to claim 1, wherein the light source module further comprises an air guiding part,
   wherein the heat sink comprises a heat dissipation fin, and
   wherein the insulating layer is provided on surfaces of the heat dissipation fin and the air guiding part.

13. The light source module according to claim 1, wherein the insulating layer is applied on the entire surface of the heat sink, and
   wherein the insulating layer has a first thickness region and a second thickness region thinner than the first thickness region.

14. A light source module comprising:
   at least one light source configured to emit light;
   a heat sink configured to absorb heat from the light source and dissipate the heat to the outside;
   an electrically insulating layer applied to at least one surface of the heat sink, the electrically insulating layer being provided as a thin film;
   a recess part provided in at least one portion of the insulating layer, the recess part having a side surface and a bottom surface;
   a conductive layer applied to at least one portion of the recess part in the insulating layer, the conductive layer providing a path for a flow of electric current to the light source; and
   a lens configured to refract light generated by the light source.

15. A lighting device using the light source module according to claim 14.

16. A method for fabricating a light source module, the method comprising:
   providing a heat sink;
   applying an electrically insulating layer on at least one surface of the heat sink, the electrically insulating layer being provided as a thin film;
   providing a metal junction face in the insulating layer, the metal junction face including at least one unevenness;
   providing a conductive layer on the metal junction face; and
   bonding a light source to the conductive layer.

17. The method according to claim 16, wherein the surface of the metal junction face is rough or has a metal core formed therein.

18. The method according to claim 16, wherein the metal junction face is provided at a bottom surface of a recess part in the insulating layer formed by recessing the insulating layer.

19. The method according to claim 16, wherein the providing of the conductive layer is performed at least once using a plating process.

20. The method according to claim 16, wherein the insulating layer is applied on the entire surface of the heat sink.

* * * * *